Sept. 27, 1966 A. B. PHILLIPS 3,275,910

PLANAR TRANSISTOR WITH A RELATIVE HIGHER-RESISTIVITY BASE REGION

Filed Jan. 18, 1963 2 Sheets-Sheet 1

INVENTOR.
Alvin B. Phillips

BY Mueller & Aichele

ATTYS.

Sept. 27, 1966

A. B. PHILLIPS 3,275,910

PLANAR TRANSISTOR WITH A RELATIVE HIGHER-RESISTIVITY BASE REGION

Filed Jan. 18, 1963

2 Sheets-Sheet 2

INVENTOR.
Alvin B. Phillips

BY Mueller & Aichele

ATTY'S.

United States Patent Office 3,275,910
Patented Sept. 27, 1966

3,275,910
PLANAR TRANSISTOR WITH A RELATIVE HIGHER-RESISTIVITY BASE REGION

Alvin B. Phillips, Scottsdale, Ariz., assignor to Motorola, Inc., Chicago, Ill., a corporation of Illinois Filed Jan. 18, 1963, Ser. No. 252,341
3 Claims. (Cl. 317—235)

This invention relates generally to transistors and in particular to a transistor having certain epitaxially formed active regions which combines some of the best features of alloyed junction transistors and all-diffused transistors.

Alloyed junction transistors have some advantages over other types which makes them presently unreplaceable in some circumstances by the newer, more generally desirable types of transistors. The primary advantage of the alloyed device over the all-diffused junction type, for example, is the fact that the saturation voltage $V_{CE(SAT)}$ may be made lower and the emitter to base breakdown $BV_{EBO}$ may be made higher in the alloyed device.

$V_{CE(SAT)}$ is the voltage drop across the transistor when it is carrying current fully in the forward direction under some specified bias condition. This voltage is the sum of the junction potentials and the drops due to the internal series resistance of the transistor to current flow. When the internal resistance of the transistor is low, $V_{CE(SAT)}$ is also low. Therefore, to have a low $V_{CE(SAT)}$, the resistivity of the emitter and collector should be low and their conducting paths short, so that these regions should not be any thicker than required. There are other factors involved but their contribution is not as significant.

If the $V_{CE(SAT)}$ is high there will be a relatively large power loss in the transistor with current due to heating. In power transistors where current is usually high, the $V_{CE(SAT)}$ must be low if the transistor is to operate efficiently so that this parameter is very important in power transistors and in applications including other transistors where large currents are also handled or where little loss of signal power is permissible. Because of intermittent use, the effect of heating may be less important to device operation in some types of switching transistors, but if the power dissipated in switching, that is, the product of the $V_{CE(SAT)}$ and the collector current, is high with respect to the power rating of the transistor then, of course, the device is inefficient and less desirable as a switch.

A low $V_{CE(SAT)}$ is easy to obtain in alloyed transistors due to the low resistivities that are readily achieved in alloyed emitter and collector junctions. Characteristically, alloyed junctions are much more abrupt than diffused junctions, i.e., the change in resistivity with distance from a region of one conductivity type to a region of the opposite conductivity type is much larger in the alloyed junction. They may have certain manufacturing disadvantages, however, which in some cases may outweigh the operational advantages of the low $V_{CE(SAT)}$. Among the disadvantages, the primary ones are that in an alloyed junction transistor the junctions tend to be less regular than if formed by diffusion for example, and it is also difficult to obtain base widths to the same degree of thinness and accuracy that may be obtained by diffusion.

The emitter-to-base breakdown voltage $BV_{EBO}$ is the reverse voltage at which the emitter-base junction will go into avalanche breakdown, and depending upon the circuit in which the transistor is used, avalanche breakdown may result in destruction of the transistor. A high $BV_{EBO}$ can, therefore, act somewhat as a safety feature on a transistor since the emitter-to-base junction cannot avalanche at a transient voltage less than the value of $BV_{EBO}$.

In a switching transistor, a high $BV_{EBO}$ also allows a high reverse voltage to be applied to the emitter-base junction to give improved switching characteristics. A high $BV_{EBO}$ is useful in a switching transistor since in most common switching networks, this high emitter-to-base reverse voltage aids in sweeping charge from the transistor so that the turn off time for the transistor is reduced and, therefore, it is able to perform more quickly.

In the simple alloy transistor, a $BV_{EBO}$ of a desired value is easily prepared by adjusting the resistivity of just the base region of the transistor. Although the value of $BV_{EBO}$ has a functional dependence on the resistivity values of both the emitter and base regions, in practice the value of the alloyed emitter region is customarily of such a very low resistivity at all points that it is considered negligible in $BV_{EBO}$ calculations, thus a higher $BV_{EBO}$ is prepared by simply designing to include a higher resistivity base region.

With the other common transistor structures such as the diffused base alloy and diffused base-diffused emitter structures, obtaining a high $BV_{EBO}$ requires extra processing steps such as electrolytic etching of the emitter-base junction or outdiffusing.

At the state of the art, planar passivated transistors, for example, are made by selectively diffusing the junctions through openings in a passivating film of silicon dioxide or glass. Since the film is put on first, and this is presently the preferred way of making these devices since devices so produced demonstrate an extremely high junction quality, the junction cannot be electrolytically etched. Outdiffusion of the surface introduces an extra operation in the processing but will give satisfactory values of $BV_{EBO}$. However, while planar passivated transistors with the extra processing can be made to exhibit high $BV_{CBO}$, they do not exhibit a low $V_{CE(SAT)}$ characteristic since the base grades into a relatively high resistivity collector region which has appreciably high internal series resistance.

Generally alloyed transistors have exhibited higher back currents and a lower level of reliability than the planar passivated transistors. As a result of the passivating film, the latter transistors exhibit low noise, low back currents, and greater reliability. However, planar passivated transistors are of the all-diffused junction type and, therefore, do not have the low $V_{CE(SAT)}$ associated with alloyed transistors.

Alloyed junction power transistors are usually prepared by using massive alloying techniques where rather thick quantities of the alloying material are used in forming the junctions. Alloying materials usually have a rather high thermal resistance in the case of the more common or frequently used materials which include indium, lead and tin. The other common material is aluminum which, although fairly conductive thermally, has a rather high coefficient of thermal expansion, and this tends to strain the device when massive amounts of the material are used. The other materials, indium, lead and tin, have lower coefficients of thermal conductivity and when used in power transistors, tend to degrade the power handling capabilities of the devices. Since their use results in a rather high temperature gradient being set up across this metal region due to low heat transfer, the active element of the device tends to become overheated.

It would be very desirable if a transistor fabricating process were available that could be used for manufacturing passivated transistors having low $V_{CE(SAT)}$ and $BV_{EBO}$ that was at the same time capable of being used for manufacturing these transistors to very small operational tolerances as has not been possible in the past.

Accordingly, it is an object of this invention to provide a means of mass producing transistor devices with low $V_{CE(SAT)}$, high $BV_{EBO}$, good power handling capability if required, excellent reproducibility with respect to base width and overall device geometry, and having smooth regular junctions, low back currents, low noise and high reliability.

A feature of this invention is the use of epitaxial and diffusion methods for establishing and controlling a base width of a transistor and additionally thereby forming reasonably abrupt base-collector and emitter-base junctions similar in characteristics to those formed by alloying.

In accordance with this invention a transistor having certain features of alloyed transistors as well as those of planar passivated transistors may be made by the combined use of epitaxial methods and selective diffusion methods. A heavily-doped substrate which will be the collector of the device has an epitaxial region formed on it which will be the base of the transistor and the collector-base junction is defined by diffusing through the base into the substrate the same conductivity type impurity as that of the collector. The emitter is formed by selectively diffusing an opposite conductivity impurity in the base and thereby completing the junctions and the geometry of the transistor. The transistor is completed by metallizing and mounting to a header and by conventional device fabrication techniques from this point on. The drawings and the following text describe the invention in detail.

Figures 1, 2, 3, 4, 5, 6, 7, 8, 9:
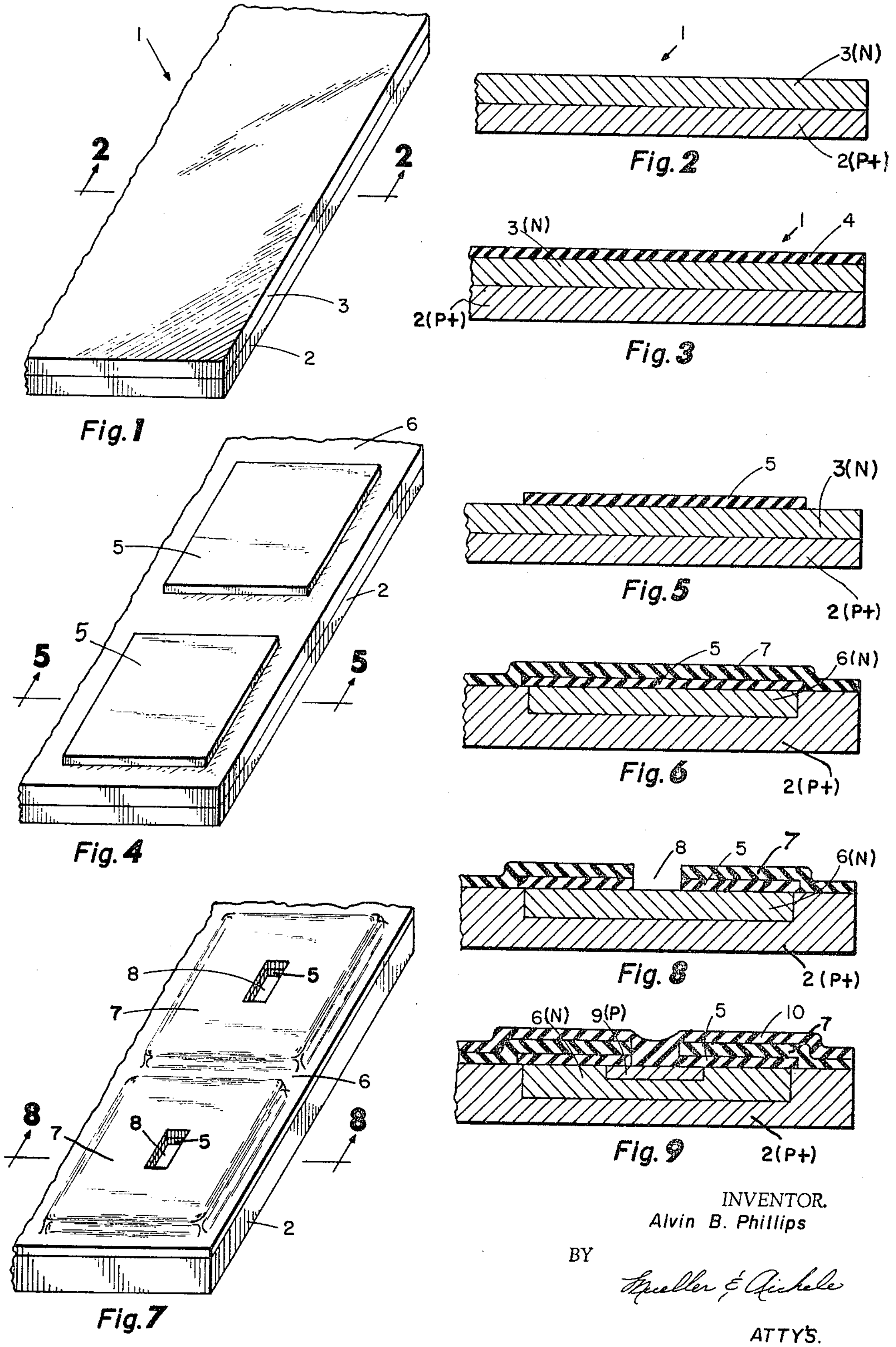
FIG. 1 is an isometric view of a section of a wafer of silicon of one conductivity type covered with an epitaxial film of silicon of an opposite conductivity type.
FIG. 2 is a section of this wafer along 2—2.
FIG. 3 shows the same section after a layer of silicon dioxide has been formed on the surface of the wafer.
FIG. 4 shows an isometric view of the wafer after a region of silicon dioxide has been selectively removed from said wafer.
FIG. 5 shows the wafer in cross section along 5—5.
FIG. 6 shows the same cross section but after a P-type diffusion has been selectively performed on said surface and a layer of glass has been formed on said wafer.
FIG. 7 shows an isometric view of the wafer after additional regions of silicon dioxide and glass have been selectively etched from said wafer.
FIG. 8 shows the wafer in a cross section at 8–8.
FIG. 9 shows the same cross section after a diffusion has been performed and another region of glass has been formed on the wafer.

FIG. 1 shows a wafer 1 of silicon after an epitaxial region 3 of N-type material has been grown on a substrate of P-type silicon in order to form the wafer as shown. The lower region 2 is quite heavily doped and is, therefore, P+ silicon.

The epitaxial material, part of which will become the base of transistor of this invention, is formed by the reduction of silicon tetrachloride. In this process silicon tetrachloride vapor is mixed with hydrogen and caused to flow over the silicon substrate. The silicon tetrachloride is reduced by the hydrogen to form silicon and gaseous hydrogen chloride on contacting the hot substrate and the epitaxial film is formed on the substrate as a result. The epitaxial film is doped while growing to obtain the desired base resistivity by introducing an impurity into the system while growing the film. The process used is explained in detail in a copending application of John T. Law, Serial No. 168,425, filed January 24, 1962, now U.S. Patent No. 3,173,814, and assigned to the present assignee.

FIG. 2 is a section of this wafer taken along line 2—2 to show more clearly the P+ material 2 and the epitaxial region 3 which will subsequently become the collector-base junction of the transistor.

After the epitaxial region has been formed the wafer is subjected to selective diffusion methods which are well-known in the art beginning with an oxidizing process in which the wafer 1 is heated to an elevated temperature and exposed to water vapor. The water vapor reacts with the silicon to form a silicon dioxide film 4 which is shown in FIG. 3 across the surface of the wafer 1. In the drawings the silicon dioxide is shown only at the top of the wafer, but in fact all portions of the wafer are covered with silicon dioxide. The silicon dioxide is not shown on the balance of the wafer so as to avoid confusion in the explanation and to simplify the drawings.

After the silicon dioxide has been grown on the wafer, the wafer is subjected to a photolithographic process in which a photo resist or light sensitive masking material is initially applied to the silicon. This photo resist is resistant to the action of hydrofluoric acid and this is important to subsequent processing. The masking material or resist on the silicon is exposed to light or shadow in certain defined areas by shining ultraviolet light onto the resist through a master pattern of the desired configuration. In the areas exposed to light the masking material becomes strongly adherent to the silicon dioxide while the portion of the masking material which has not been exposed to light is readily washed away from the silicon dioxide in a developing and washing operation. The squares of silicon dioxide 5 shown on the wafer of FIG. 4 have been formed by this photolithographic process and by a subsequent etching process. Following the exposure to light and washing away of the unexposed photo resist, these squares are formed by exposing the wafer to hydrogen fluoride in the form of dilute hydrofluoric acid or hydrofluoric acid fumes. Silicon dioxide is readily etched by hydrogen fluoride except where covered by the photo resist which prevents the hydrofluoric acid from making contact with the silicon dioxide. This etches away the undesired portions of the silicon dioxide leaving the rectangular squares as shown in FIG. 4. The silicon is not attacked by the hydrofluoric acid. The portion of the wafer beneath the remaining silicon dioxide rectangles will form the active transistor regions at a further point of the process, and subsequently the wafer will be cut apart in the space between the rectangular regions of silicon dioxide. These regions of silicon dioxide are shown more clearly in FIG. 5 which is a section of FIG. 4 taken along 5—5.

FIG. 6 shows the wafer after a P-type impurity such as boron has been diffused into the wafer. The silicon dioxide 5 has acted as a mask against diffusion of boron impurities so that the regions of the epitaxial material covered by silicon dioxide have not been diffused and the regions which were not covered have been diffused. The P-type impurity was diffused through the epitaxial material and into the underlying substrate so that the wafer is P-type from top to bottom except beneath those regions where epitaxial material was protected by the silicon dioxide. Subsequently each of these regions, so isolated, will become a base region of a transistor. The additional glass film 7 is a borosilicate glass which was formed as a part of the diffusion process.

Figure 10:
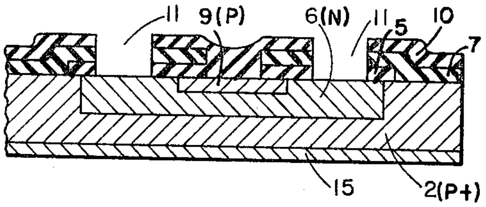
FIG. 10 shows a cross section after a diffusion step has been performed to prepare the wafer for metallizing the base.

FIG. 7 is a view of the wafer after a small rectangular window 8 has been etched in each of the larger rectangular portions of the silicon dioxide 5 on the silicon and in the glass film 7 (see also FIG. 8). These windows will be used in a subsequent selective diffusion of P-type material into the remaining N-type epitaxial material in order to form the emitter region of the transistor. After diffusion, the surface of the emitter 9 is essentially in the shape of the smaller rectangular window 8 and this is shown clearly in the sectional view of FIG. 9. Note that the junction of the emitter 9 and the base diffusion 6 at the surface of the silicon lies completely beneath the silicon dioxide 5 and glass film 7 so that the junction is passivated. A new film 10 is another layer of borosilicate glass formed as a part of the boron diffusion. After the emitter junction is formed, the wafer is then subjected to a further photolithographic treatment and hydrofluoric acid etching to clear a region 11 in the silicon dioxide 5 and glass films 7 and 10 covering the base region 6 of the device (FIG. 10). This region surrounds the four sides of the emitter region 9 of the transistor. After this has been done, this base region is diffused with phosphorus impurity to prepare the N region for a subsequent alloying step with aluminum. The N-type phosphorus diffusion is to increase the level of N impurity so that the aluminum cannot form a P region in the N material.

Photolithographic techniques are again used after this diffusion to open a region on the emitter for making contact to the emitter junction. The emitter and base are then metallized with aluminum using well-known high vacuum and alloying techniques.

Figure 11:
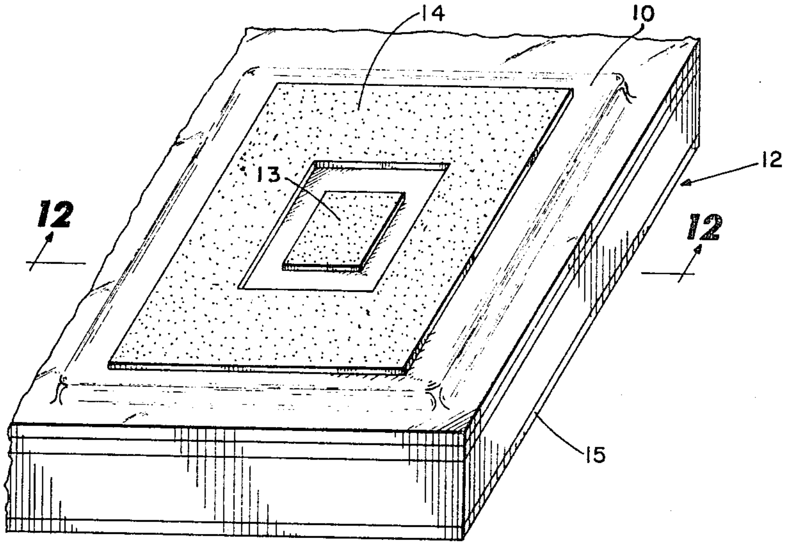
FIG. 11 shows a transistor element which was formed on said wafer after the wafer has been cut up into individual transistor elements.
Figure 12:
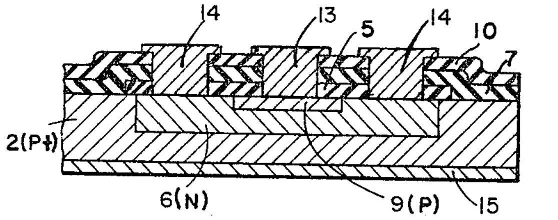
FIG. 12 shows the transistor element in cross section along 12—12.

FIG. 11 is a completed transistor element 12 which has been cut from the original wafer of silicon. This figure is shown several times larger in scale than in the previous drawings for clarity. This figure shows the aluminum metallized emitter 13 and base 14 regions and these metallized regions extend somewhat over the surface of the silicon dioxide. The metallizing in the final active region of the device are shown somewhat more clearly in the sectional view of FIG. 12 which is taken along 12—12 of FIG. 11. The metal emitter 13 and base 14 regions make electrical contact to the silicon of the emitter region 9 and base region 6 of the transistor element. In the smaller devices made by the method of this invention, the metallizing is allowed to extend over the surface of the silicon dioxide as shown in order to provide a somewhat larger metallized region thereby reducing the resistance of these thin metallic films and also facilitating electrical or wired connection with such techniques as thermocompression bonding and/or other bonding techniques since the target area for the wire attachment is increased. The collector region of the device which, of course, includes the larger P+ region 2 of the transistor element is metallized with gold or some other suitable metal to form a film 15 as shown. The collector metallizing 15 extends across the complete surface of the wafer and this is useful in providing a large surface collector contact in order to remove heat generated during the time when the device is being actively used. This large area contact also tends to aid in reducing the collector resistance of the transistor.

The base-emitter junction may be made very abrupt with the present diffusion technology utilizing very thin diffusions of quite high surface concentration. This tends to give for the diffused PN junction an impurity concentration versus distance curve which is very steep and thus approaches the impurity distribution and, therefore, the character of an alloyed junction. Since this is a shallow junction which is formed in a short period of time, the abrupt character of the junction formed by the epitaxial base region on the substrate or collector region is present because diffusion of impurity from each region into the other is minimized.

Because of this fact that impurity from the substrate and the epitaxial layer diffuse to some extent while forming the thermally grown oxide films and during the heating of the semiconductor material during the three selective diffusion steps, the abrupt character of the epitaxial material to substrate PN junction is also best preserved by choosing impurity materials for these diffusions of a nature such that they diffuse rapidly into the silicon and by using doping materials in the substrate and epitaxial region that diffuse more slowly. While it is not essential that this be done, the device so made will tend to exhibit lowest $V_{CE(SAT)}$ characteristic.

The epitaxial base of the transistor may be doped during its formation to a desired uniform impurity level or graded to form a carrier accelerating field condition similar to that of a drift transistor. Epitaxial regions may be grown accurately to very fine tolerances with respect to thickness and to impurity level and distribution. The $BV_{EBO}$ characteristic of the device is obtained by growing the epitaxial region to the appropriate resistivity level, or if an accelerating field is desired, to the appropriate resistivity gradient. Since the high surface concentration of impurities which characterize regions formed by solid state diffusion are avoided by epitaxially growing the base, a device having a high $BV_{EBO}$ is easily obtained without requiring any extra processing toward this end. The epitaxial base device will normally have a high $BV_{EBO}$ unless something is done to decrease it.

A diffused emitter region which is very shallow has tolerances which are almost negligible so that a very closely controlled base width is readily achieved in production. Since the concentration of P impurity in the emitter region and the collector region may be easily made quite high, the device resistance and, therefore $V_{CE(SAT)}$ may be made very low. Thus, the transistor has junction characteristics similar to that of an alloyed device.

Figure 13:
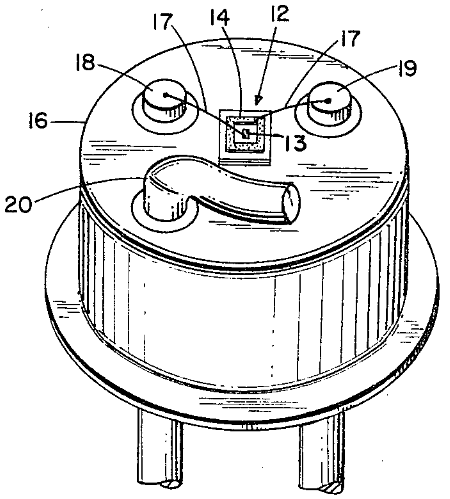
FIG. 13 shows the transistor element after mounting on a header and after the leads have been attached.

FIG. 13 shows the transistor after mounting to an ordinary three lead transistor header 16. The collector of the device is bonded directly by fusion of the gold metallized collector region to the header. Fine wires 17 are thermocompression bonded to the emitter and base contacts and to the emitter 18 and base leads 19 of the header. The collector lead 20 of the header is bent over and welded to the case of the header as shown. After thermocompression bonding the transistor is tested and a cap (not shown) is placed on the header to enclose the active element and the device is sealed by welding. It is then given a more complete final testing to complete the device.

An operating silicon transistor similar to that described and shown in FIG. 1 through FIG. 13 and suitable for amplification at frequencies up to 100 megacycles per second has a boron diffused P-type emitter 15 mils long by 5 mils wide by 2 microns deep and has a sheet resistance of 5 ohms per square. The emitter contact of aluminum is 4 mils long by 14 mils wide and is 5000 angstrom units thick. The epitaxially grown N-type base is 20 mils long by 10 mils wide by 6 microns deep and has a uniform resistivity of 1 ohm-centimeter. The base metallizing around the emitter as shown in the drawings is also of aluminum and is 1 mil wide and 5000 angstrom units thick. The doping of the epitaxial region used to form the base of the device is diffused with phosphorus in the region where the aluminum contact to the base is evaporated on and alloyed. This, of course, is to prevent the formation of a PN junction by having this part of the N-type base of a sufficiently heavy concentration that the material is not compensated enough to become P-type where alloyed with the aluminum. This diffusion is effectively of the order of a micron deep and has a surface concentration of about $10^{21}$ atoms per cubic centimeter. The die itself is about 25 mils long by 25 mils wide by about 6 mils thick. The bottom face of the die is metallized with a P-type gold alloy across the bottom surface for making electrical contact to the collector and this material also serves for fusing the semiconductor element to the header. This $P^+$ portion of the collector had an initial resistivity of .01 ohm-centimeter. The peripheral diffusion which was used in establishing the collector and base geometry of the device has a surface concentration of boron of $10^{19}$ atoms per cubic centimeter and has a minimum internal resistivity about equal to that of the original substrate material.

This type transistor even when of a very small size for high frequency or high speed switching service is also easy to manufacture at high yields of good devices. The base width, which is ordinarily very critical, is formed to the dimensions required with little difficulty and with little processing loss. A particular embodiment of the invention has the following device parameters.

*Table 1*

| Symbol | Measurement | Value |
|---|---|---|
| $BV_{CBO}$ | Breakdown voltage, collector-to-base junction reversed biased with open emitter. | 45 v. |
| $BV_{EBO}$ | Breakdown voltage, emitter-to-base junction reverse biased with open collector. | 45 v. |
| $h_{FE}$ | Common-emitter D.C. short-circuit forward current transfer-ratio current gain; the ratio of collector-to-base current. | 80. |
| $V_{CE(SAT)}$ | Saturation voltage; collector-to-emitter voltage drop with transistor fully conducting. | .02 v. at 10 ma. |
| $f_{ab}$ | Alpha cutoff frequency; frequency at which the ratio of collector current-to-emitter current is 2½ times its value at 1 kc. | 30 mc. |

The transistor embodiment just referred to has an excellent $V_{CE(SAT)}$ characteristic and a high $BV_{EBO}$ characteristic approximating that of an alloyed transistor device. In addition the transistor exhibits the desirable features of the typical passivated transistor including such characteristics as high reliability, low noise and low reverse currents.

I claim:

1. A transistor including a semiconductor unit having first and second major surfaces on opposite sides thereof, a base region of substantially uniform thickness in said semiconductor unit of higher resistivity material than the remainder of said semiconductor unit and having a portion at said first surface thereof, an emitter region of lower resistivity material than said base region extending into said semiconductor unit from a portion of said first surface and substantially smaller in area than said first surface, a collector region of lower resistivity material than said base region on the side of said base region opposite said emitter region, said collector region having a portion extending from within said semiconductor unit to said first surface and there surrounding said base region, said emitter region and said collector region being of the conductivity type opposite that of said base region and defining abrupt PN junctions with said base region which emerge from said semiconductor unit at said first surface thereof, insulating material on said first surface of said semiconductor unit entirely covering the portions of said PN junctions at said first surface, and individual electrical connections to said emitter region, said base region, and said collector region.

2. A transistor including a semiconductor unit having first and second major surfaces on opposite sides thereof, a base region in said semiconductor unit of higher resistivity material than the remainder of said semiconductor unit and having a portion at said first surface thereof, an emitter region of lower resistivity material than said base region extending into said semiconductor unit from a portion of said first surface and substantially smaller in area than said first surface, a collector region of lower resistivity material than said base region on the side of said base region opposite said emitter region, said collector region having a portion thereof at said second surface of said semiconductor unit, and said collector region having a further portion extending from within said semiconductor unit to said first surface and there surrounding said base region, said emitter region and said collector region being of the conductivity type opposite that of said base region and defining abrupt PN junctions with said base region which emerge from said semiconductor unit at said first surface thereof, insulating material on said first surface of said semiconductor unit entirely covering the portions of said PN junctions at said first surface, first and second electrical connections to said emitter and base regions respectively at the portions thereof available at said first surface of said semiconductor unit, and means mounting said semiconductor unit at said second surface thereof and providing a third electrical connection to said collector region.

3. An improved transistor comprising a semiconductor crystal element of relatively low resistivity material, a layer of semiconductor material of substantially uniform thickness on said crystal element having a plane surface, a thin emitter region of relatively low resistivity material extending into said layer from said plane surface and defining in said layer an emitter junction extending to said surface and surrounding said emitter region at said surface, a base region in said layer surrounding said emitter region at said surface and bounded by a smooth, regular and abrupt collector junction formed, at the deepest part thereof, between said layer and said crystal element and extending through said layer to said plane surface, a third region extending from said surface completely through said layer and defining the portion of said collector junction extending through said layer, and a protective coating of insulating material completely covering said emitter and collector junctions at said surface, the material in said base region having a relatively high resistivity value for increasing the avalanche breakdown voltage of said junctions, with the low resistivity of the material in said emitter region and that in said crystal element decreasing the saturation voltage of the transistor.

References Cited by the Examiner

UNITED STATES PATENTS

| | | | |
|---|---|---|---|
| 2,878,152 | 3/1959 | Runyan et al. | 317—235 |
| 2,938,819 | 5/1960 | Genser | 317—235 |
| 2,959,719 | 11/1960 | Ezaki | 317—235 |
| 2,981,877 | 4/1961 | Noyce | 317—235 |
| 3,025,589 | 3/1962 | Hoerni | 317—235 |
| 3,033,714 | 5/1962 | Ezaki | 317—235 |
| 3,038,087 | 6/1962 | Luscher | 317—235 |
| 3,065,392 | 11/1962 | Pankove | 317—235 |
| 3,070,466 | 12/1962 | Lyons | 148—1.5 |
| 3,074,826 | 1/1963 | Tummers | 148—1.5 |
| 3,089,794 | 5/1963 | Marinace | 317—235 |
| 3,108,209 | 10/1963 | Knowles | 317—234 |
| 3,131,098 | 4/1964 | Krsek et al. | 317—235 |

JOHN W. HUCKERT, *Primary Examiner.*

JAMES D. KALLAM, *Examiner.*

C. E. PUGH, *Assistant Examiner.*